United States Patent [19]
Fletcher et al.
[11] 3,831,117
[45] Aug. 20, 1974

[54] CAPACITANCE MULTIPLIER AND FILTER SYNTHESIZING NETWORK

[76] Inventors: James C. Fletcher, Administrator of the National Aeronautics and Space Administration with respect to an invention by; Arthur J. Kline, 6453 E. Monta Rosa St., Scottsdale, Ariz. 85251

[22] Filed: Nov. 15, 1972

[21] Appl. No.: 306,652

[52] U.S. Cl. .................. 333/80 R, 330/69, 307/230
[51] Int. Cl. ........................ H03h 7/44, H03h 11/00
[58] Field of Search .......... 330/103, 69; 307/230 C; 333/80 RC, 80 TC

[56] References Cited

UNITED STATES PATENTS 3,451,006 6/1969 Grangaard, Jr. ...................... 330/69

*Primary Examiner*—Nathan Kaufman
*Attorney, Agent, or Firm*—Paul F. McCaul; Monte F. Mott; John R. Manning

[57] ABSTRACT

A circuit using a differential amplifier multiplies the capacitance of a discrete integrating capacitor by $(R_1 + R_2)/R_2$ where $R_1$ and $R_2$ are values of discrete resistor coupling an input signal $e_1$ to the amplifier inputs. The output $e_o$ of the amplifier is fed back and added to the signal coupled by the resistor $R_2$ to the amplifier through a resistor of value $R_1$. A discrete resistor $R_x$ may be connected in series for a lag filter and a discrete resistor may be connected in series with the capacitor for a lead-lag filter. Voltage dividing resistors $R_a$ and $R_b$ may be included in the feedback circuit of the amplifier output $e_o$ to independently adjust the overall circuit gain $e_i/e_o$.

5 Claims, 4 Drawing Figures

CAPACITANCE MULTIPLIER AND FILTER SYNTHESIZING NETWORK

ORIGIN OF INVENTION

The invention described herein was made in the performance of work under a NASA contract and is subject to the provisions of Section 305 of the National Aeronautics and Space Act of 1958, Public Law 85-568 (72 Stat. 435; 42 USC 2457).

BACKGROUND OF THE INVENTION

This invention relates to filter networks, and more particularly to networks for synthesizing an effective capacitance much larger than that provided by an included capacitor.

There is a need in many applications for a circuit to synthesize a capacitor or other impedance, such as in an integrating circuit, with an effective capacitance much larger than that provided by a discrete capacitor. For example, in a communications system for spacecraft intended to be used in the exploration of planets, microminiaturization of the circuits aboard the spacecraft is essential. If a very large capacitor or other impedance is required in the system, such as a long term integrator of about 5,000 seconds in a phase-lock-loop filter, it becomes necessary to synthesize the capacitor with microminiaturized components.

In synthesizing an effective filter with a time constant much larger than that provided by discrete elements, it is frequently important that the filter transfer function have a particular lead-lag characteristic, or that it have either only a lead or a lag characteristic. In addition, it may be desirable, or even necessary, for the filter to have a finite voltage gain. Consequently, it is desirable or necessary to be able to adjust the gain of the filter independently of the transfer function, where the transfer function is of the form:

$$e_o/e_1 = A([1 + \tau_2 S]/[1 + \tau_1 S]) \quad (1)$$

where $S$ is equal to $j\omega$, $j$ is equal to $\sqrt{-1}$ and $\omega$ is the angular frequency $2\pi f$.

A straight-forward circuit for synthesizing this transfer function may consist of a high gain inverting amplifier with an input resistor $R_1$, a feedback resistor $R_f$ and an RC circuit in parallel with the feedback resistor consisting of a resistor $R_2$ in series with a capacitor C. In that circuit the time constant $\tau_1$ is equal to $R_fC$, the time constant $\tau_2$ is equal to $R_2C$, and A is equal to $R_f/R_1$. It is evident that in this straightforward circuit, any change of $R_f$ necessary to change the lag characteristic of the filter will cause a change in the gain A. Consequently, the larger the effective capacitor between the input terminal and circuit ground, the greater the gain. Therefore, an attenuator would be required at the output to compensate for increased gain whenever gain must not be affected. An attenuator at the input to the filter circuit may not be acceptable to compensate for increased gain because of the voltage offset which would be introduced. What is needed is a circuit having the general transfer function of Equation 1 with an adjustable gain independent of the lag or lead-lag characteristics of the circuit, i.e., independent of the integrating RC time constant of the circuit.

OBJECTS AND SUMMARY OF THE INVENTION

An object of the invention is to provide a circuit for synthesizing an effective capacitive element value much greater than that of included elements without causing large voltage swings and subsequent power supply limitations.

Another object is to provide a circuit for synthesizing an effective filter with an integrating RC time constant much greater than that of included discrete elements with a desired lag or lead-lag characteristic.

Still another object is to provide a circuit for synthesizing a lag or lead-lag filter with an independently adjustable voltage gain.

These and other objects of the invention are achieved by a differential amplifier having one input terminal connected to an input junction by a first resistive means, an output terminal connected to a second input terminal by a second resistive means and to the input junction by a third resistive means, and an impedance means connected between the one input terminal of the amplifier and circuit ground. The effective impedance of the impedance means is inversely proportional to the ratio of the sum of the first and third resistive means to the third resistive means. A fourth resistive means couples an input signal to the input junction to implement a filter having a transfer function of the following general form:

$$e_o/e_1 = (1 + \tau_2 S)/(1 + \tau_1 S) \quad (2)$$

To provide a DC gain factor A for the entire circuit, the second resistive means is comprised of two resistors in series with a resistor between circuit ground and the connection between the two series resistors. The transfer function is then of the form given by Equation 1. The gain A can be adjusted independently of time constants $\tau_1$ and $\tau_2$ by adjusting the ratio of the resistor connected to circuit ground to the sum of that resistor and the resistor connected in series with the resistive means, but when that is done the ratio of the fourth resistive means to the third resistive means must be readjusted to reset $\tau_1$ to the desired value, i.e., a desired gain A can be achieved independently of $\tau_1$ and $\tau_2$ by suitable selection of resistor values.

Other objects and advantages of the invention will become apparent from the following description with reference to the drawings.

DESCRIPTION OF THE PREFERRED EMBODIMENTS

Figure 1:
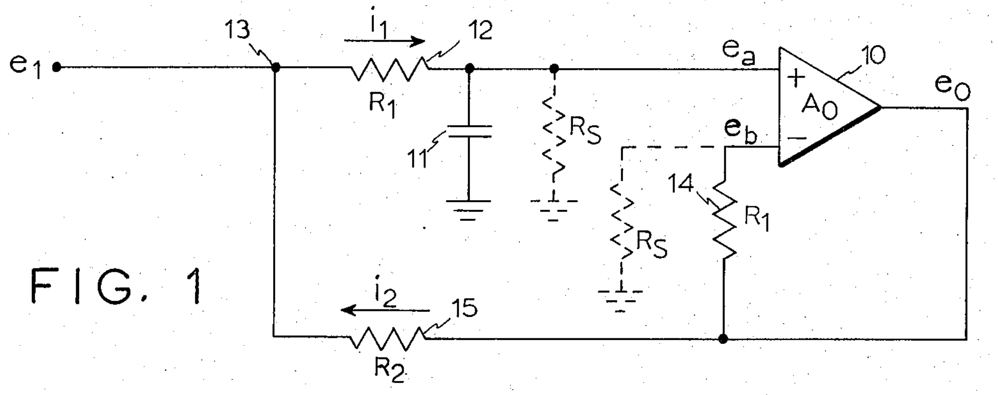
FIG. 1 illustrates a circuit for synthesizing an effective capacitance much larger than the capacitance of an included capacitor.

Referring to FIG. 1, a differential amplifier 10 is shown in a circuit which synthesizes an effective capacitance much larger than that of a discrete capacitor 11 connected between one terminal of the amplifier and circuit ground. A resistor 12 connects that terminal of the amplifier to a junction 13. A resistor 14 connects the other terminal of the amplifier to the output terminal of the amplifier. The junction 13 is connected to the output terminal of amplifier by a resistor 15.

The resistor 14 is selected to be equal to the resistor 12 and is provided in the circuit to cancel current offset in the circut due to current into the amplifier from the junction between the capacitor 11 and the resistor 12. In an ideal amplifier there would be no input current, but since no amplifier is without input current, it is necessary to provide the resistor 14. In the following analysis of the circuit, the offset due to input current is taken into consideration by assuming a resistor $R_s$ in parallel with the capacitor 12. The resistor $R_s$ is shown in dotted line to indicate that it is not a discrete element, but is instead a path for stray current into the amplifier. A corresponding stray current path is indicated at the other input terminal of the amplifier.

The current through the resistor 12 is given by:

$$i_1=\frac{e_1}{R_1+\frac{R_s}{1+R_sCS}}=\frac{(1+R_sCS)}{R_s\left(1+\frac{R_1}{R_s}+R_1CS\right)}e_1 \quad (3)$$

The voltage across the capacitor is given by:

$$e_a=i_1\frac{R_s}{1+R_sCS}=\frac{e_1}{1+\frac{R_1}{R_s}+R_1CS} \quad (4)$$

The voltage at the other input terminal of the amplifier is given by:

$$e_b=[R_s/(R_1+R_s)]\ e_o \quad (5)$$

The amplifier output voltage is:

$$e_o=A_o(e_a-e_b) \quad (6)$$

where $A_o$ is the open loop gain of the operational amplifier. Since $A_o$ is very large, it follows that $e_b$ is very nearly equal to $e_a$. Assuming that to be exact, the output voltage $e_o$ in terms of the input voltage $e_i$ is obtained from Equations 4 and 5 as follows:

$$e_o=\frac{e_1}{1+\frac{R_1}{R_s}+R_1CS}\cdot\frac{R_1+R_s}{R_s} \quad (7)$$

The input current $i$ is then given by:

$$i=i_1-i_2=\frac{1+R_sCS}{R_s\left(1+\frac{R_1}{R_s}+R_1CS\right)}e_1+\frac{e_1}{R_2}$$

$$-\frac{R_1+R_s}{R_2R_s}\cdot\frac{e_1}{1+\frac{R_1}{R_s}+R_1CS}$$

$$=e_1\frac{R_2(1+R_sCS)+R_s\left(1+\frac{R_1}{R_s}+R_1CS\right)-R_1-R_s}{R_2R_s\left(1+\frac{R_1}{R_2}+R_1CS\right)} \quad (8)$$

From the input voltage and current the input impedance $Z_i$ is determined to be:

$$Z_i=\frac{e_i}{i}=\frac{R_2R_s\left(1+\frac{R_1}{R_2}+R_1CS\right)}{R_2+R_2R_sCS+R_1R_2CS}=\frac{1+\frac{R_1}{R_s}+R_1CS}{\frac{1}{R_s}+\frac{R_1+R_2}{R_2}CS} \quad (9)$$

If $R_s$ is very large, as it is in a good amplifier, the equivalent circuit is a resistor $R_{eq}$ in series with a capacitor $C_{eq}$ between the junction 13 and circuit ground, where:

$$R_{eq}=R_1R_2/(R_1+R_2) \quad (10)$$

$$C_{eq}=[(R_1+R_2)/R_2]C \quad (11)$$

Figure 2:
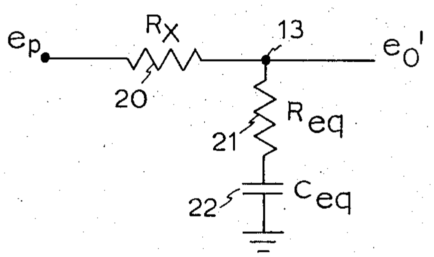
FIG. 2 illustrates the equivalent circuit of FIG. 1 with an input resistor to form a filter with lag or lead-lag transfer characteristics.

The effective capacitance given by Equation 11 is much larger than the discrete capacitor C by the factor $(R_1+R_2)/R_2$. The circuit can be used to implement circuits which require a large capacitor, such as a lag or low-pass filter for a phase-locked loop, as shown in FIG. 2 where the equivalent resistance $R_{eq}$ and capacitance $C_{eq}$ are shown as discrete elements 21 and 22, but are to be understood to represent the entire circuit of FIG. 1 between junction 13 and circuit ground. To accomplish that, the circuit of FIG. 1 is driven through a resistor 20 and the output taken either directly at the junction 13, as shown, or at the output of the amplifier.

The input voltage to the synthesizing circuit at junction 13 is given by:

$$e_i=e_p\ [Z_i/(R_x+Z_i)] \quad (12)$$

where $e_p$ is the voltage input to the resistor 20.

Substituting for $Z_i$ in Equation 12 from Equation 9 and then computing the output voltage $e_o'$ from Equation 7 yields the following:

$$e_o'=e_p\frac{R_1+R_s}{R_1+R_s+R_1R_sCS+R_xR_s\left(\frac{R_1+R_sCS}{R_s}\right)} \quad (13)$$

The ratio of voltage output $e_o$ to voltage input $e_p$ may be obtained directly from Equation 13 by dividing the numerator and the denominator of the ratio by $R_1+R_s$, and rearranging terms which yield the following:

$$\frac{e_o'}{e_p}=\frac{R_1+R_s}{R_1+R_s+R_x}\cdot\frac{1}{1+\left(\frac{R_1R_s}{R_1+R_s+R_x}+\frac{R_1+R_s}{R_1+R_s+R_x}\cdot\frac{R_x}{1+\frac{R_1}{R_x}}\cdot\frac{R_1+R_2}{R_2}\right)CS} \quad (14)$$

Letting $K=1+R_x/(R_1+R_s)$, Equation 14 reduces to:

$$\frac{e_o'}{e_p}=\frac{1}{K}\cdot\frac{1}{1+\left(\frac{1}{K}\cdot\frac{R_1R_s}{R_1+R_s}+\frac{1}{K}\frac{R_x}{1+\frac{R_1}{R_x}}\cdot\frac{R_1+R_2}{R_2}\right)CS}$$

$$\frac{e_o'}{e_p}=\frac{1}{K}\cdot\frac{1}{1+\frac{1}{K}\left(\frac{R_1R_s}{R_1+R_s}+\frac{R_x}{1+\frac{R_1}{R_x}}\cdot\frac{R_1+R_2}{R_2}\right)CS}$$

$$=\frac{1}{K}\cdot\frac{1}{1+\frac{\tau_1}{K}S} \quad (15)$$

where:

$$\tau_1=\left(\frac{R_1R_s}{R_1+R_s}+\frac{R_x}{1+\frac{R_1}{R_x}}\cdot\frac{R_1+R_2}{R_2}\right)C$$

$$\approx[R_1+R_x(\{R_1+R_2\}/R_2)]C \quad (16)$$

Equation 15 demonstrates that the effect of the finite input impedance $R_x$ is to reduce the filter gain by a factor 1/K and to reduce the filter lag by the same factor. Consequently, the finite input impedance $R_x$ must be taken into consideration in the design of the filter.

Figure 3:
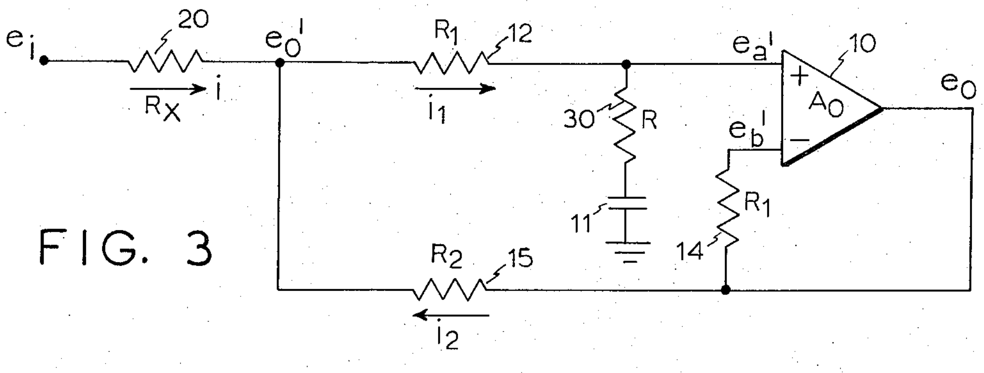
FIG. 3 illustrates a filter implemented from the effective capacitance of the circuit in FIG. 2 with lead transfer function characteristics added.

A simple means of achieving a lead term in the filter described with reference to FIG. 2 is to put a discrete resistor 30 in series with the capacitor 11, as shown in FIG. 3. For convenience, the same reference numerals are employed in FIG. 3 as for the filter of FIG. 2 in the circuit of FIG. 1. All of the discussion of FIGS. 1 and 2 will apply to FIG. 3, except that the resistance $R_1$ is not the same value employed in previous calculations. Analysis of this circuit will now be set forth with the impedance of the resistor 30 in series with the capacitor represented by Z. The currents in the two branches are:

$$i_1=e_o'/(R_1+Z) \quad (17)$$

$$i_2=(e_o'-e_o)/R_2 \quad (18)$$

The voltages in the circuit are then given by:

$$e_a=j_2Z=\frac{e_o'}{1+\frac{R_1}{Z}} \quad (19)$$

Assuming no amplifier input current, $e_b'$ is equal to $e_o$ $$e_o/A=e_a-e_b\approx o \quad (20)$$

$$=\frac{e_o'}{1+\frac{R_1}{Z}}-e_o$$

$$\therefore e_o=\frac{e_o'}{1+\frac{R_1}{Z}} \quad (21)$$

$$e_o'=e_o(1+R_1/Z) \quad (22)$$

In determining these voltages, the input currents to the amplifier are neglected since in practice they are very small. The sum $i$ of the currents is:

$$i=i_1-i_2=(e_i-e_o')/R_x \quad (23)$$

By substituting for the currents $i_1$ and $i_2$ from Equations 17 and 18, and in the resulting equation substituting for $e_o'$, the following equation is derived:

$$e_o(R_2R_x+R_xR_1+R_xZ+R_2R_1)=e_1ZR_2 \quad (24)$$

The transfer function ratio of $e_o$ to $e_i$ is then given by:

$$\frac{e_o}{e_1}=\frac{Z}{R_1+\frac{R_1+R_2}{R_2}R_x+Z} \quad (25)$$

By letting $R_1+[(R_2+R_1)/R_2]R_x=R'$, the transfer function can be expressed as follows:

$$\frac{e_o}{e_1}=\frac{Z}{R'+Z} \quad (26)$$

Then by letting $Z=R+1/CS=(1+RCS)/CS$, the transfer function can be expressed as follows:

$$e_o/e_1=(1+RCS)/[1+(R+R')CS]$$
$$=(1+\tau_2S)/(1+\tau_1S) \quad (27)$$

Where $\tau_1=(R+R')C$ (28)

$$\tau_2=RC \quad (29)$$

where $R$ is the resistance of resistor 30.

In that manner the lead term $1 + \tau_2 S$ of Equation 1 can be synthesized while multiplying the capacitance of the capacitor 30 by a desired factor and providing a filter with the desired lag term $1 + \tau_1 S$.

Figure 4:
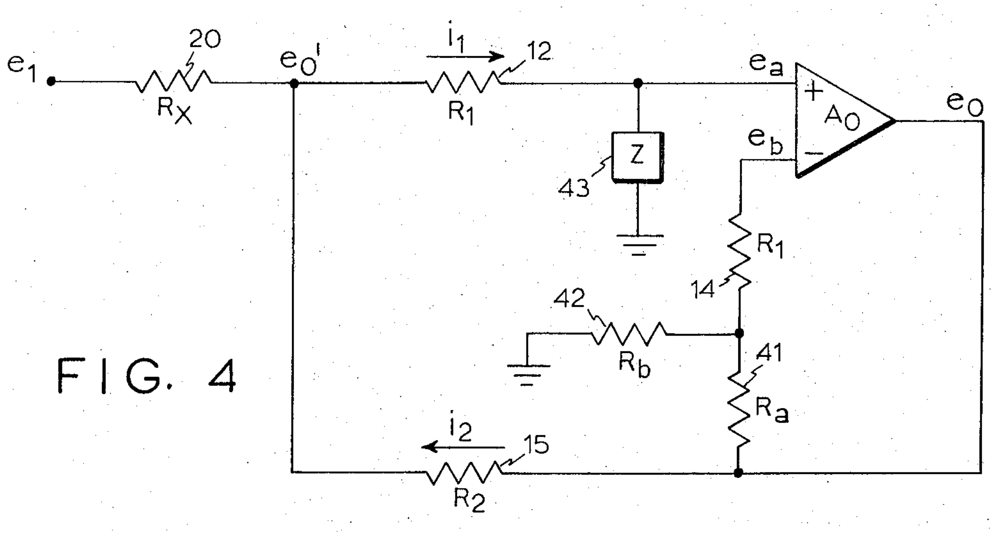
FIG. 4 illustrates a filter implemented from the effective capacitance of the circuit of FIG. 3 with finite voltage gain which can be set independently of the filtering characteristics.

Because some amplifier input current will be present, and we have now assumed no such current in FIG. 3, there will be an offset voltage. To reduce the offset voltage, it is desired to maximize the ratio of $R_2$ to $R_x$, but that will decrease the effective multiplication factor for the capacitance. If some stage gain can be tolerated, a compromise can be reached with independently controlled gain as shown in FIG. 4.

The currents $i_1$ and $i_2$ are as given by Equations 17 and 18 even though resistors 41 and 42 are added to the circuit. The capacitance to be multiplied is contained in the impedance 43 which may be a resistor in series with a capacitor, as in FIG. 3, just a capacitor, as in FIG. 1, or some other impedance circuit. The ratio K of the sum $R_a + R_b$ to the shunt resistor $R_b$ will affect the voltage $e_b$ as follows:

$$e_b = e_o/K \tag{30}$$

$$\therefore e_o = K e_b = K \frac{e_o'}{1+\frac{R_1}{Z}} \tag{31}$$

$$e_o' = (e_o/K)\,(1 + R_1/Z) \tag{32}$$

Equations 31 and 32 are the same as Equations 21 and 22 for the circuit of FIG. 3, except for the factor K, thus demonstrating that it is possible to independently adjust gain of the circuit. The sum of the currents $i_1$ and $i_2$ is still as in Equation 23. By substituting for the currents $i_1$ and $i_2$ from Equations 17 and 18 in Equation 23, and in the resulting equation substituting for $e_o$, the following equation is derived:

$$e_o\,[R_2R_x + R_xR_1 + (1-K)R_xZ + R_2R_1 + R_2z] = e_1KZR_2 \tag{33}$$

Comparing Equations 24 and 33 shows that they are the same but for the factors K and $(1 - K)$ introduced by the resistors 41 and 42. Transfer function is then given by the following equation:

$$e_o/e_i = KZR_2/[R_2R_x + R_xR_1 + (1-K)R_xZ + R_2R_1 + R_2Z]$$

$$= K\frac{Z}{R_1+\frac{R_1+R_2}{R_2}R_x+\left[(1-K)\frac{R_x}{R_2}+1\right]Z}$$

$$= \frac{K}{(1-K)\frac{R_x}{R_2}+1}\cdot\frac{Z}{Z+\left[\frac{R_1+\left(\frac{R_1+R_2}{R_2}\right)R_x}{(1-K)\frac{R_x}{R_2}+1}\right]} \tag{34}$$

By again letting $Z = R + 1/CS$ for a resistor in series with a capacitor as in FIG. 3, and letting $$R' = A[R_b/(R_a + R_b)]\,[R_1 + \{(R_2 + R_1)/R_2\}\,R_x] + R,$$

the transfer function can be expressed as:

$$e_o/e_1 = A\,(1 + RCS)/(1 + R'CS) \tag{35}$$

where the gain factor $A$ is given by the following equation:

$$A=\frac{1+\left(\frac{R_b}{R_a}\right)}{\left(\frac{R_b}{R_a}\right)-\left(\frac{R_x}{R_2}\right)} \tag{36}$$

Solving for the resistor ratio $R_b$ to $R_a$ yields the following:

$$\frac{R_b}{R_a}=\frac{1+A\left(\frac{R_x}{R_2}\right)}{A-1} \tag{37}$$

Letting $R_1 = R_x$, (38) and $$\frac{R'}{R_x}=\frac{A}{1+\frac{R_a}{R_b}}\left[2-\frac{R_x}{R_2}\right]=M \tag{39}$$

then $A\,(R_x/R_2)^2 + (2A - M + 1)\,(R_x/R_2) + 2 = M$ (40)

Equations 39 and 40 are the final design equations for a lead-lag filter circuit having independently adjustable gain A, i.e., ratio of output $e_o$ to input $e_1$.

Although particular embodiments of the invention have been described and illustrated herein, it is recognized that modifications and equivalents may readily occur to those skilled in the art and consequently it is intended that the claims be interpreted to cover such modifications and equivalents.

What is claimed is:

1. A network for synthesizing an effective capacitive element value much larger than that provided by circuit elements including a capacitive element without causing large voltage swings and subsequent power limitations comprised of

- a differential amplifier having first and second input terminals and an output terminal for producing at said output terminal a voltage signal proportional to the difference between voltage signals on said first and second input terminals,
- resistive means having a resistance of value $R_1$ coupling said first input terminal to a junction adapted to receive an input signal,
- means connecting said capacitive element between said first input terminal and a source of reference potential,
- resistance means having a resistance value $R_1$ connecting said output terminal of said amplifier to said second input terminal, and
- resistive means having a resistance value $R_2$ connecting said output terminal of said amplifier to said junction, whereby the equivalent circuit is a resistance $R_{eq}$, equal to the ratio of the product $R_1R_2$ to the sum $R_1 + R_2$, in series with a capacitance $C_{eq}$ equal to the ratio of the sum $R_1 + R_2$ to the value of $R_2$.

2. A network as defined by claim 1 including resistive means having a resistance $R_x$ for coupling said input signal from a signal input terminal to said junction, whereby an effective filter is synthesized with a time constant much larger than that of said capacitor and the separate resistive means having values equal to $R_1$, $R_2$ and $R_x$.

3. A network as defined in claim 2 including series resistive means having a resistance $R_a$ in series to said second input terminal of said amplifier, and shunt resistive means having a resistance $R_b$ connected between said source of reference potential and a junction between said series resistive means and said resistive means connecting said output terminal to said second input terminal of said amplifier, whereby an effective filter is synthesized with an overall voltage gain which can be adjusted independently of network time constants by selection of said resistance values $R_a$ and $R_b$.

4. A network as defined by claim 2 including a resistor in series with said capacitor between said first input terminal of said amplifier and said source of reference potential, whereby an effective lead-lag filter is synthesized with respective lag and lead time constants $\tau_1$ and $\tau_2$ much larger than that of said capacitor, the separate resistive means having values equal to $R_1$, $R_2$ and $R_x$, and said series resistor having a resistance value equal to R, said lag time constant $\tau_1$ being the product $(R + R')C$, where $R'$ is equal to $R_1 + R_x (R_2 + R_1)/R_2$ and said lead time constant $\tau_2$ being the product RC in a network having a transfer function between said signal input terminal and said output terminal of said amplifier equal to $A(1 + \tau_2 S)/(1 + \tau_1 S)$, where S is equal to $j\omega$, $\omega$ is the angular frequency of said input signal, and A is the gain of said network.

5. A network as defined in claim 4 including series resistive means having a resistance $R_a$ in series with said resistive means connecting said output terminal to said second input terminal of said amplifier, and shunt resistive means having a resistance $R_b$ connected between said source of reference potential and a junction between said series resistive means and said resistive means connecting said output terminal to said second input terminal of said amplifier, whereby an effective lag filter is synthesized with an overall voltage gain A which can be adjusted independently of said time constants $\tau_1$ and $\tau_2$ by selection of said resistances $R_a$ and $R_b$, and suitable selection of ratio $R_x/R_2$ of said resistance $R_x$ to said resistance $R_2$, where said ratio $R_x/R_2$ is obtained from the following equation, for desired values of A and M, upon letting $R_1$ equal $R_x$:

$$A\,(R_x/R_2)^2 + (2A - M + 1)\,(R_x/R_2) + 2 = M$$

where $M = R'/R_x$
and $R' = A[R_b/(R_a - R_b)]$

* * * * *